(12) United States Patent
Stamper

(10) Patent No.: US 9,058,973 B2
(45) Date of Patent: Jun. 16, 2015

(54) PASSIVE DEVICES FABRICATED ON GLASS SUBSTRATES, METHODS OF MANUFACTURE AND DESIGN STRUCTURES

(75) Inventor: Anthony K. Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 459 days.

(21) Appl. No.: 13/085,970

(22) Filed: Apr. 13, 2011

(65) Prior Publication Data
US 2012/0261787 A1    Oct. 18, 2012

(51) Int. Cl.
| | |
|---|---|
| *H01L 21/00* | (2006.01) |
| *H01L 27/01* | (2006.01) |
| *H01L 49/02* | (2006.01) |
| *H01L 23/544* | (2006.01) |

(52) U.S. Cl.
CPC ............... *H01L 27/01* (2013.01); *H01L 28/10* (2013.01); *H01L 28/20* (2013.01); *H01L 28/40* (2013.01); *H01L 23/544* (2013.01); *H01L 2223/54406* (2013.01); *H01L 2223/54413* (2013.01); *H01L 2223/54426* (2013.01); *H01L 2223/54433* (2013.01); *H01L 2924/0002* (2013.01)

(58) Field of Classification Search
USPC .......... 438/459, 464, 479, 697, 700, 735, 743
See application file for complete search history.

(56) References Cited

U.S. PATENT DOCUMENTS

| | | | |
|---|---|---|---|
| 5,705,855 A | 1/1998 | Carson et al. | |
| 6,225,207 B1 * | 5/2001 | Parikh | 438/622 |
| 6,265,684 B1 | 7/2001 | Wu | |
| 6,946,314 B2 | 9/2005 | Sawyer et al. | |
| 7,098,117 B2 | 8/2006 | Najafi et al. | |
| 7,190,005 B2 | 3/2007 | Gibb et al. | |
| 7,380,338 B2 | 6/2008 | Lee | |
| 7,572,738 B2 | 8/2009 | Nogami | |
| 8,384,507 B2 * | 2/2013 | Li et al. | 336/200 |
| 2004/0137374 A1 * | 7/2004 | Jung et al. | 430/313 |
| 2005/0084201 A1 * | 4/2005 | Akashi et al. | 385/14 |
| 2006/0030120 A1 | 2/2006 | Shao et al. | |
| 2008/0277765 A1 * | 11/2008 | Lane et al. | 257/622 |
| 2009/0101958 A1 | 4/2009 | Lin et al. | |
| 2010/0044853 A1 | 2/2010 | Dekker et al. | |
| 2010/0294146 A1 * | 11/2010 | Fragala et al. | 101/28 |
| 2010/0304176 A1 * | 12/2010 | Watanabe et al. | 428/596 |
| 2011/0037161 A1 | 2/2011 | Andry et al. | |

* cited by examiner

*Primary Examiner* — Ori Nadav
(74) *Attorney, Agent, or Firm* — Anthony Canale; Roberts Mlotkowski Safran & Cole, P.C.

(57) ABSTRACT

Passive devices fabricated on glass substrates, methods of manufacture and design structures are provided. The method includes forming an opaque or semi-opaque layer on at least a first side of a glass substrate. The method further includes forming one or more passive devices on the opaque or semi-opaque layer on a second side of the glass substrate.

4 Claims, 5 Drawing Sheets

PASSIVE DEVICES FABRICATED ON GLASS SUBSTRATES, METHODS OF MANUFACTURE AND DESIGN STRUCTURES

FIELD OF THE INVENTION

The invention relates to semiconductor structures and methods of manufacture and, more particularly, to passive devices fabricated on glass substrates, methods of manufacture and design structures.

BACKGROUND

Glass wafers or substrates in semiconductor applications are known to provide many advantages over other wafer materials. These advantages include, for example, high resistivity and low RF coupling to devices. Also, during manufacturing processes, glass wafers do not heat up as much as other types of wafers and, hence do not succumb to a degraded quality factor to the extent of other wafer materials.

However, in order to use glass wafers for device fabrication, it is necessary to have special tools for material handling. This results in many constraints such as, for example, cost and unnecessary downtime for conventional semiconductor fabrication automated handling tooling, which cannot process glass wafers.

For example, conventional semiconductor fabrication automated handling tooling are specifically designed for silicon based wafers, which may have wafer identification alphanumerics and machine readable bar codes on their back sides. These tools shine light on the wafer to verify that the wafer is present. In addition, these tools also assist in the proper and accurate alignment of the wafer, so the wafer can undergo subsequent processing. By way of illustration, the automated handling tooling will transport the wafer from one processing tool to another processing tool, e.g., a processing chamber to a lithography machine (e.g., stepper). By shining light onto the wafer, the presence of the wafer can be detected or the wafer backside bar code may be read. Also, by the use of alignment marks and/or identification marks, the automated handling tooling can verify wafer identification and proper alignment is achieved in all axes, i.e., x-y-z axes.

The conventional semiconductor fabrication automated handling tooling, though, cannot perform these same functions with glass substrates. Specifically, as the glass substrate is transparent, the automated handling tooling cannot detect the presence of the glass substrate. Also, the automated handling tooling cannot identify the glass substrate.

Accordingly, there exists a need in the art to overcome the deficiencies and limitations described hereinabove.

SUMMARY

In a first aspect of the invention, a method comprises forming an opaque or semi-opaque layer on at least a first side of a glass substrate. The method further comprises forming one or more passive devices on the opaque or semi-opaque layer or on a second side of the glass substrate.

In another aspect of the invention, a method comprises forming an opaque layer on a backside of a glass substrate. The method further comprises forming crackstops in a frontside of the glass substrate. The method further comprises forming one or more passive devices directly through the frontside of the glass substrate. The method further comprises removing the opaque layer on the backside of the glass substrate prior to packaging.

In yet another aspect of the invention, a method of identifying a glass substrate using silicon wafer handling equipment comprises positioning a semiconductor fabrication automated handling tooling over a glass substrate. The method further comprises shining light onto the glass substrate to determine its presence. The method further comprises detecting the presence of the glass substrate. The method further comprises identifying the glass substrate using identification marks on an opaque surface, using the semiconductor fabrication automated handling tooling. The method further comprises transporting the glass substrate to a next processing stage based on its identification information.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the MEMS or other passive devices fabricated on a glass substrate, which comprises the structures of the present invention. In still further embodiments, a method in a computer-aided design system is provided for generating a functional design model of the MEMS or other passive devices fabricated on a glass substrate. The method comprises generating a functional representation of the structural elements of the MEMS or other passive devices fabricated on a glass substrate.

More specifically, in aspects of the present invention, a method in a computer-aided design system for generating a functional design model of a semiconductor device with glass substrate, comprises: generating a functional representation of an opaque layer on a backside of a glass substrate; generating a functional representation of crackstops in a frontside of the glass substrate; generating a functional representation of one or more passive devices directly through the frontside of the glass substrate; and generating a functional representation of a removal of the opaque layer on the backside of a glass substrate prior to packaging.

In still another aspect of the present invention, a structure comprises a glass wafer with a backside identification mark and coated on a backside or both sides in an opaque or semi-opaque layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
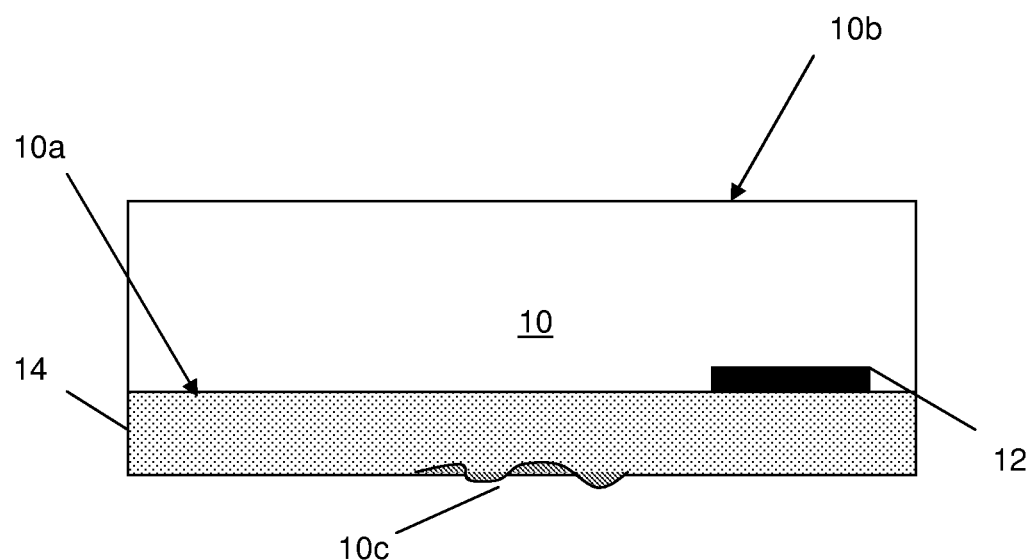
FIG. 1 shows a beginning structure and respective processing steps in accordance with an aspect of the present invention.

The invention relates to semiconductor structures and methods of manufacture and, more particularly, to passive devices fabricated on glass substrates, methods of manufacture and design structures. In embodiments, the present invention includes the manufactures of passive devices such as, for example, micro-electromechanical systems (MEMS), inductors, capacitors, etc. directly on a glass substrate, e.g., amorphous silica glass, the resultant structures and design structures. In embodiments, the passive devices can be fabricated on the glass substrate without using a temporary substrate which is bonded to the glass substrate. In this way, the present invention eliminates the conventional steps of forming the passive device first on a temporary substrate, bonding the temporary substrate to the glass substrate, and then removing the temporary substrate, e.g., dissolved wafer process, to leave the passive device on the glass substrate.

Advantageously, the passive devices of the present invention can be manufactured using conventional silicon substrate tooling, without the need for any tool modifications. For example, both silicon and glass wafers could be processed concurrently in the same manufacturing facility without any segregation or special handling of either the glass or silicon wafers. In this way, the present invention takes advantage of the high resistivity of the glass substrate without the need for expensive retooling of semiconductor fabrication facilities. For example, in embodiments, the glass substrate comprises features which permit processing of the glass substrate in a semiconductor fabrication facility that is equipped with processing tools for silicon wafer production. These features include, for example, an opaque layer on the backside, frontside, or both sides of the glass substrate so that the conventional processing tools for silicon wafer production can verify the presence of the wafer at stages within the fabrication processing.

More specifically, the present invention includes a glass substrate with an opaque or semi-opaque layer on a backside, frontside, or both sides thereof The opaque or semi-opaque layer acts as a non-transparent backing so that wafer alignment tools, e.g., automated handling tools, can verify the presence of the glass substrate during fabrication processes. In embodiments, the glass substrate can also include, for example, alignment and overlay marks formed on the glass substrate surface. These alignment and overlay marks can be, for example, open trenches, trenches filled with dielectric, metal, or semiconductor material, dielectric, metal, or semiconductor material sub-etched onto the wafer surface, any of which should be visible from the glass substrate backside. In further embodiments, the glass substrate can include a notch or flat feature for wafer alignment, as well as a backside barcode and wafer identification etched or ablated into the glass. In further embodiments, the glass substrate should meet silicon wafer flatness, roughness, diameter, thickness, impurity, etc. specifications, so that the glass substrate can be easily adapted for use with conventional processing tools for silicon wafer production using, for example, CMOS devices, for fabrication of, e.g., MEMS or other passive devices.

FIG. 1 shows a beginning structure and respective processing steps in accordance with an aspect of the present invention. More specifically, FIG. 1 shows a glass substrate represented by reference numeral 10. The glass substrate 10 can be, for example, boroflouride glass or other amorphous silica glass. In embodiments, the glass substrate 10 meets the necessary requirements for fabricating devices in a semiconductor fabrication facility that is equipped with processing tools for silicon wafer production. For example, the glass substrate 10 meets flatness, roughness, thickness, impurity, metallics, etc. specifications for silicon wafer fabrication tooling, well known to those of ordinary skill in the art, so that silicon wafer processing tools are not contaminated. For example, sodium (Na) and iron (Fe) concentration in the glass wafers would be less than 1E10 atoms/cm$^2$ so that the glass wafers would not contaminate a gate oxidization furnace with sodium, which would degrade the electrical properties of CMOS devices.

By way of illustrative example, the glass substrate 10 can be about 200 mm in diameter; although other dimensions are also contemplated by the present invention such as, for example, between a range of about 150 mm to about 450 mm. In further embodiments, the glass substrate 10 should have a low sodium, potassium, gold, and/or silver content as used for semiconducting substrates as known in the art, e.g., less than 1E10 atoms/cm$^2$ as discussed above Na or metallic content, and a thickness of about 725 microns or whatever is used for the silicon, silver, etc. content as used for semiconducting substrates as known in the art e.g., less than 1E10 atoms/cm$^2$ Na or metallic content, and a thickness of about 725 microns or whatever is used for the silicon wafer processing equipment within a predetermined tolerance. The thickness of the glass substrate 10 will ensure that breakage does not occur during handling and processing of the glass substrate 10. Although the present invention focuses on sharing glass and silicon wafer processing equipment, it is also contemplate by the present invention to sharing of processing tooling for any type of substrates, i.e., GaAs, Sapphire, Sapphire on silicon, Ge, etc.

In still further embodiments, the glass substrate 10 can include, for example, a backside barcode and wafer identification information as discussed above, generally shown at reference numeral 12. Reference numeral 12 can also be representative of an alignment mark, which is a notch or flat portion. In embodiments, the backside barcode and wafer identification information can be read from a frontside or backside of the glass substrate 10.

Still referring to FIG. 1, a layer 14 is formed on the backside 10a of the glass substrate 10. In embodiments, the layer 14 is an opaque or semi-opaque layer used for wafer handling and chucking in conventional tools used for silicon wafer processing. The layer 14 can be a temporary layer that is removed prior to packaging (e.g., pre-dicing). In addition, advantageously, the layer 14 can add to the thickness of the glass substrate 10 to thus provide further mechanical rigidity to the glass substrate 10 and prevent breakage during handling and processing. Although layer 14 is shown on the wafer backside, it also could be formed on both the wafer backside and frontside; or on the wafer frontside only.

In embodiments, the layer 14 can be any appropriate opaque or semi-opaque layer that can reflect light for detection and/or identification by automated handling tools, equipped for silicon wafer fabrication. For example, the layer 14 can be a metal such as, for example, tungsten or aluminum or other opaque metals such as gold or platinum. In further embodiments, the opaque layer 14 can be an insulator material or silicon based material or other materials that can be detected by the automated handling tools, equipped for silicon wafer fabrication.

In embodiments, the tungsten can be deposited using conventional chemical vapor deposition processing (CVD). The aluminum, on the other hand, can be sputtered onto the backside of the glass substrate 10. In further embodiments, the layer 14 can be arsenic doped silicon, which can also be used as a conductor for electrostatic chucking. In further embodiments, the layer 14 can be a silicon layer deposited using high temperature (e.g., about 700° C. to 800° C.) CVD processes. For example, silicon can be deposited on all sides of the glass substrate 10 to a thickness of about 0.2 microns using low pressure CVD (LPCVD) processes; although other thicknesses are also contemplated by the present invention. The silicon can be optionally removed from the frontside 10b of the glass substrate 10 by a conventional etching process such as, for example, reactive ion etching (RIE) or wet chemical etching on a tool that etches material from one side of the wafer. In embodiments, the layer 14 can remain on the frontside 10b of the glass substrate 10 for device fabrication.

It is contemplated by the present invention, that the backside 10a of the glass substrate 10 can be roughened by, for example, backside grinding, prior to the forming of the layer 14. The roughening 10c may provide better adhesion properties for the layer 14, as well as additional properties for identification of the wafer with conventional automated handling tools, equipped for silicon wafer fabrication. In embodiments, the layer 14 can conformally fill the roughened surface, as well as any bar code or other identification mark 12.

In still further embodiments, the layer 14 can include, for example, the backside barcode and wafer identification information 12. In this embodiment, the backside barcode and wafer identification information 12 can be read from a backside of the glass substrate 10. The backside barcode and wafer identification information 12 could be scribed, laser ablated, or etched into the wafer backside, as known in the art for silicon wafers.

Figure 2:
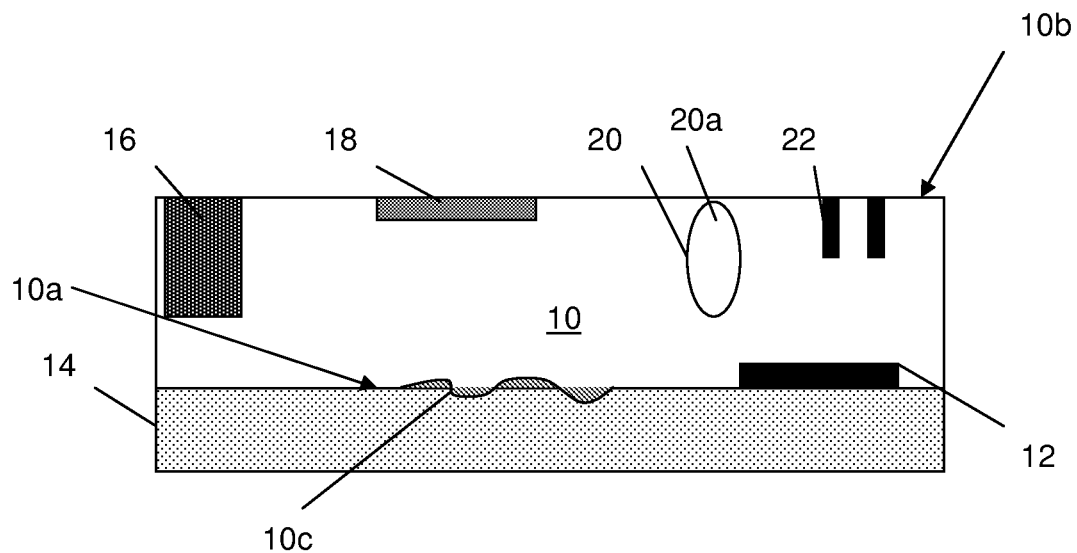
FIGS. 2-6 show additional structures and respective processing steps in accordance with an aspect of the present invention.

FIG. 2 shows additional processing steps and respective structure in accordance with aspects of the present invention. More specifically, FIG. 2 shows several features and/or structures fabricated on a frontside 10b of the glass substrate 10 in accordance with aspects of the present invention. In embodiments, the features and/or structures are fabricated on the frontside 10b of the glass substrate 10 using conventional silicon wafer fabrication tools (but using a glass substrate). For example, amongst other features and structures, the present invention contemplates the fabrication of one or more crackstops 16, one or more passive devices 18, one or more pinched off crackstops 20 and/or wafer backside alignment marks 22. It should be understood that other features and/or structures are also contemplated by the present invention on the frontside 10b of the glass substrate 10.

In embodiments, the crackstop 16 can be a polysilicon or metal filled damascene crackstop trench fabricated using lithography, etching and deposition processes. For example, a resist can be formed on the surface of the glass substrate 10 and exposed to light to form a pattern (e.g., openings). A reactive ion etching (RIE) can be used to form a trench or through via in the glass substrate 10. In embodiments, the depth of the trench or through via can be about 100 microns to 200 microns; although other dimensions are also contemplated by the present invention such as, for example, about 5 microns to 250 microns and more preferably 5 microns to 50 microns. The diameter (or distance across the opening) of the trench or through via can be about 10 microns; although other dimensions are also contemplated by the present invention.

The trench or through via can then be filled or partially filled with polysilicon or metal to form the crackstop 16. For example, the metal can be TiN or W or a combination of both. Specifically, the TiN can be deposited using an atomic layer deposition (ALD) and the W can be deposited using a CVD with a TSV (through silicon via) damascene process. Any residue on the surface of the glass substrate 10 can be removed or cleaned by conventional chemical mechanical polish (CMP), etchants such as, for example, a $CF_4O_2$ etchant or KOH wet etch process, as known in the art. In embodiments, the trench or through via can also remain empty; or can be partially filled and pinched off with a CVD or PVD dielectric, conductor, or semiconductor material.

The one or more passive devices 18 can include, for example, a resistor, a capacitor, e.g., deep trench capacitor, inductor or ground plane, a MEMS switch, a filter, such as a Surface Acoustic Wave (SAW) or Bulk Acoustic Wave (BAW) filter, to name but a few passive devices contemplated by the present invention. The one or more passive devices 18 can be fabricated using any conventional semiconductor fabrication method known to be used to form such devices 18. For example, a resistor can be formed by etching a trench into the glass substrate 10 using conventional lithographic and etching techniques, depositing a metal within the trench, and then removing excess metal using CMP. The depth of the resistor can be, for example, 2 microns; although other dimensions are also contemplated by the present invention. In embodiments, the resistor can be a refractory metal resistor (e.g., high resistance polysilicon resistors, which are made possible since there is no interaction with a silicon substrate). In embodiments, the resistor can be a doped polysilicon thin layer resistor formed by depositing the layer, lithographically patterning it, etching it, and stripping the photoresist prior to MEMS or other passive device processing on the glass substrate frontside 10b.

The capacitor, on the other hand, can be formed by filling the trench with plates and insulator material, as known to those of skill in the art. In embodiments, the capacitor can have an area of about 0.2 $\mu m^2$ with a capacitance density of 50 $fF/\mu m^2$ (which is about 10 times a capacitance of a high-K MIM capacitor); although other dimensions and densities are contemplated by the present invention. Alternatively, the capacitor could be formed by depositing a lower capacitor electrode, capacitor dielectric, upper capacitor electrode, patterning them, and etching them, as known in the art.

The inductor can be, for example, a spiral conductor formed within the trench. The spiral inductor can be formed from any appropriate metal such as, for example, ferrite based metals. The metals can be formed in the trench using damascene or on the surface using subtractive-etch processes.

As should be understood by those of skill in the art, the passive devices, e.g., MEMS switches, filters, resistors, capacitors and inductors, can be used for RF applications such as, for example, cellular applications. By way of illustration, the inductors can be used in analog circuits for signal processing. Also, the inductors in conjunction with the capacitors and other components can be used to form tuned circuits designed to filter out specific signal frequencies. More specifically, the one or more passive devices can be used as band pass filters for tuning radio frequency interference, for instance.

The one or more pinched off crackstops 20 can be fabricated by forming a trench, similar to the processes for the crackstop 16. A material, such as a metal, semiconductor material, or dielectric, can then be formed within the trench until a top portion of the trench is pinched off The pinch off will create a void 20a in the crackstops 20. In embodiments, oxide can be deposited or filled with CVD, PVD, PECVD, or similar conformality oxide to leave void, e.g., less than 3 mm wide.

The wafer backside alignment marks 22 can be fabricated by forming one or more trenches on the wafer frontside, similar to the processes for the crackstop 16. After formation of the trenches, a layer can be deposited in the trench, which is opaque to the wavelength(s) of light used for reading the alignment marks. For example, the material can be any material used in deposition processes of semiconductor fabrication that is opaque to, e.g., 365 nm wavelength. Illustratively, the opaque material can be, for example, dielectric, metal, or semiconductor material as already discussed herein. In embodiments, the wafer backside alignment marks 22 that were formed on the wafer frontside are visible from the backside 10a of the glass substrate 10 to aid in wafer back side processing. Optionally, layer 14 could be removed to aid in reading the alignment marks 22.

Figure 3:
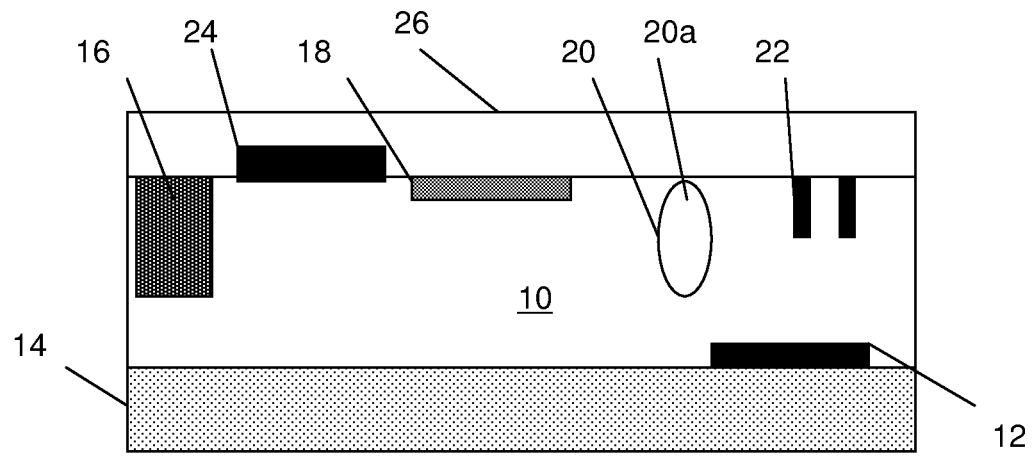

FIG. 3 shows additional processing steps and structure in accordance with aspects of the present invention. More specifically, FIG. 3 shows one or more passive devices 24 formed directly on the glass substrate 10 at a first or upper wiring layer, e.g., $M_X$ layer or $M_{X+1}$ layer where X is greater or equal to 1. The one or more passive devices 24 may be a thin layer passive device such as, for example, a resistor (e.g., sub etch resistor), a MIM capacitor, a MEMS switch, a filter, thick wire inductor (e.g., 3 to 10 microns) or a ground plane (e.g., checkerboard configuration). In embodiments, the one or more passive devices 24 can be formed by a deposition and patterning process. In embodiments, the one or more passive devices 24 can be formed from the same material used as the opaque or semi-opaque layer 14. After formation, an insulator layer 26 can be deposited on the one or more passive devices 24.

Figure 4:
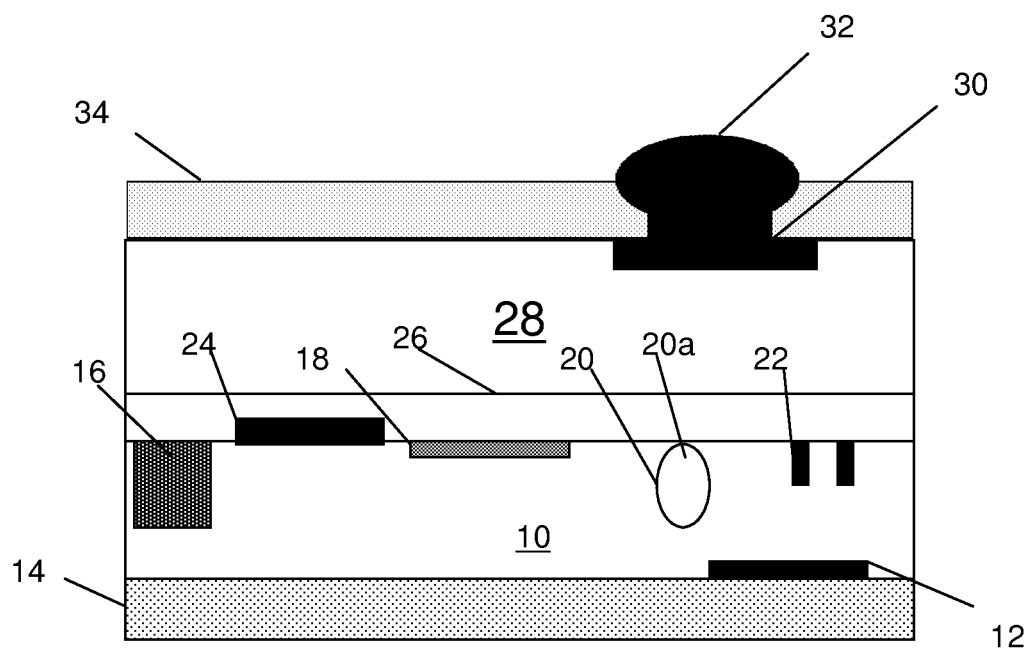

FIG. 4 shows additional processing steps and resultant structure in accordance with aspects of the invention. In FIG. 4, additional levels 28 are fabricated using conventional processes. These additional levels 28 are representative of additional MEMS or other integrated passive devices, fabricated using conventional materials and processes as discussed herein. The additional levels 28 are fabricated on the insulator layer 26 after device 18 formation; however, it should be understood by those of skill in the art that the additional levels 28 can be fabricated directly on the glass substrate.

The structure also includes a last wiring layer 30, formed in a dielectric layer of the additional levels 28. The wiring layer 30 may be, for example, damascene copper, subtractive-etch aluminum, or other interconnect wiring material, formed in an upper layer of the additional levels 28. A bond pad (e.g., TiN/AlCu/TiN, TiN/W, or TaN/Ta/Cu) and solder bump 32 are formed using, for example, conventional solder techniques. The bond pad can be multiple levels of metal formed in an upper dielectric layer 34, with an optional planarization of the dielectric layer. In embodiments, the bond pad serves as an underbump metallurgy for the solder joint for frontside packaging. Alternatively, the bond pad could be used for subsequent wirebonding of the diced chip.

Figure 5:
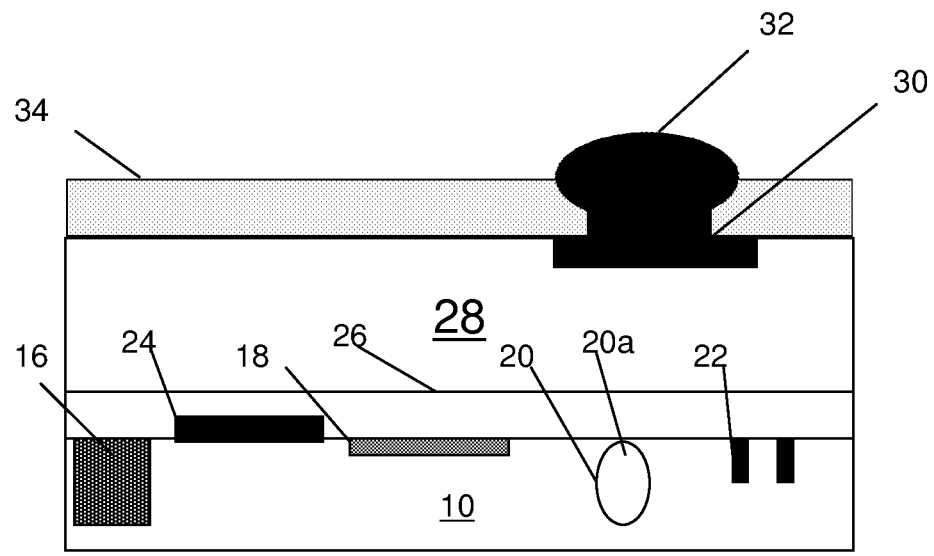

In embodiments, the layer 14 can be removed as shown in FIG. 5. In this embodiment, the layer 14 can be removed from the backside, pre-dicing or packaging of the wafer, using any well known CMP or etching processes. Alternatively, the layer 14 could be patterned to form a wiring level. In additional embodiments, the glass wafer 10 can also be thinned by a backside grinding of the glass substrate 10. The glass substrate 10 can be thinned to about 150 microns to 450 microns, for example.

Figure 6:
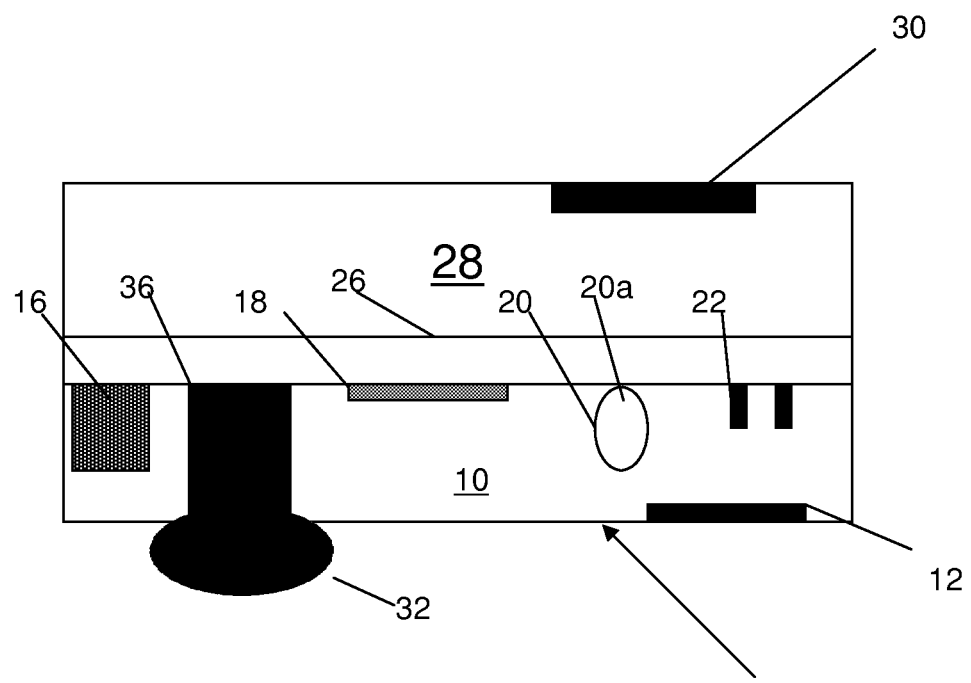

FIG. 6 shows an additional embodiment and respective fabrication steps in accordance with aspects of the present invention. In FIG. 6, the solder bump 32 is formed on the backside 10a of the glass substrate 10 with a through wafer via (TWV) 36 connecting it to the wafer frontside which could be formed concurrently. In this embodiment, there is no need to have any surface insulation on the glass substrate 10, as the glass substrate 10 is already a very good insulator. Alternatively, prior to the formation of the solder bump, one or more conductive through waver vias can be formed in the glass substrate 10. In either scenario, the through wafer via(s) (e.g., conductive wires) 36 can be formed by lithographic patterning of the wafer back side, etching the glass wafer and layer 14, if still present, and metal deposition processes as described above. The through wafer vias 36 can be, for example, formed from silver-tin solder with appropriate under layer materials such as chrome/gold, for example; although other metals are also contemplated by the present invention. In embodiments, prior to the formation of the solder joint 32, the backside layer 14 can be removed and the glass substrate 10 thinned by a grinding process.

Figure 7:
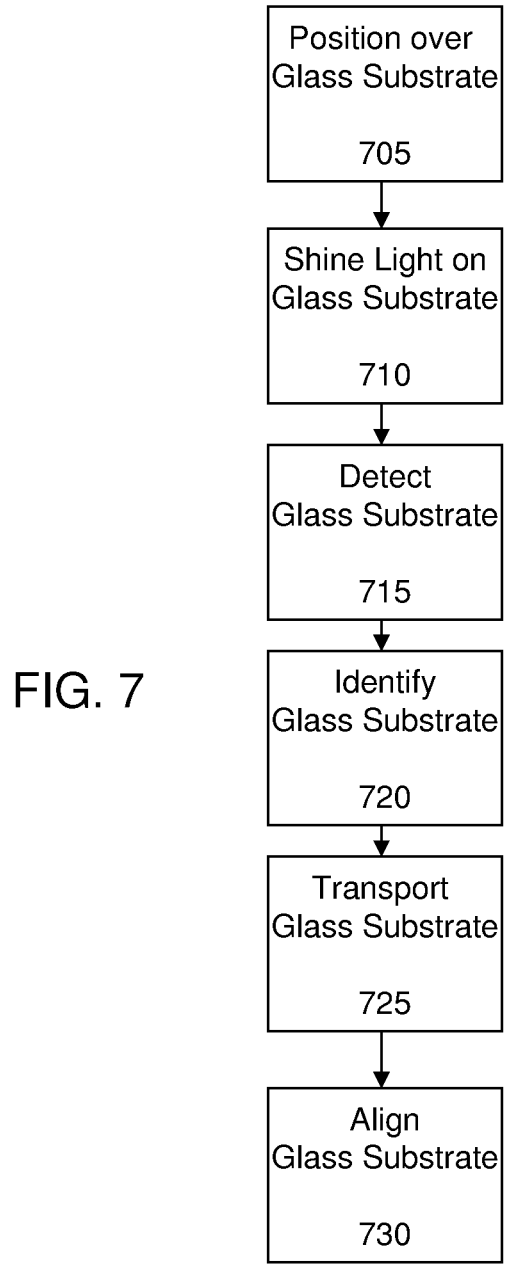
FIG. 7 is a flow diagram of steps in accordance with aspects of the present invention.

FIG. 7 shows a flow diagram in accordance with aspects of the present invention. The steps of FIG. 7 are implemented with conventional semiconductor fabrication automated handling tooling designed for silicon wafer production. The steps of FIG. 7 are also implemented with a glass substrate in accordance with aspects of the present invention. At step 705, a conventional semiconductor fabrication automated handling tooling is positioned over a glass substrate. At step 710, the conventional semiconductor fabrication automated handling tooling shines light onto the glass substrate to determine its presence. In embodiments, the presence may be detected by the light being bounced back to the tool, by the opaque surface of the glass substrate. As an alternative, the opaque surface of the glass substrate can block the light from shining to a sensor. At step 715, the presence of the glass substrate is detected. At step 720, an identification of the glass substrate is detected, and at step 725, the glass substrate is transported to a next processing stage (e.g., based on its identification information). At step 730, the conventional semiconductor fabrication automated handling tooling aligns the glass substrate at the next processing stage for further fabrication such as, for example, lithography, etching, deposition, grinding, etc.

Figure 8:
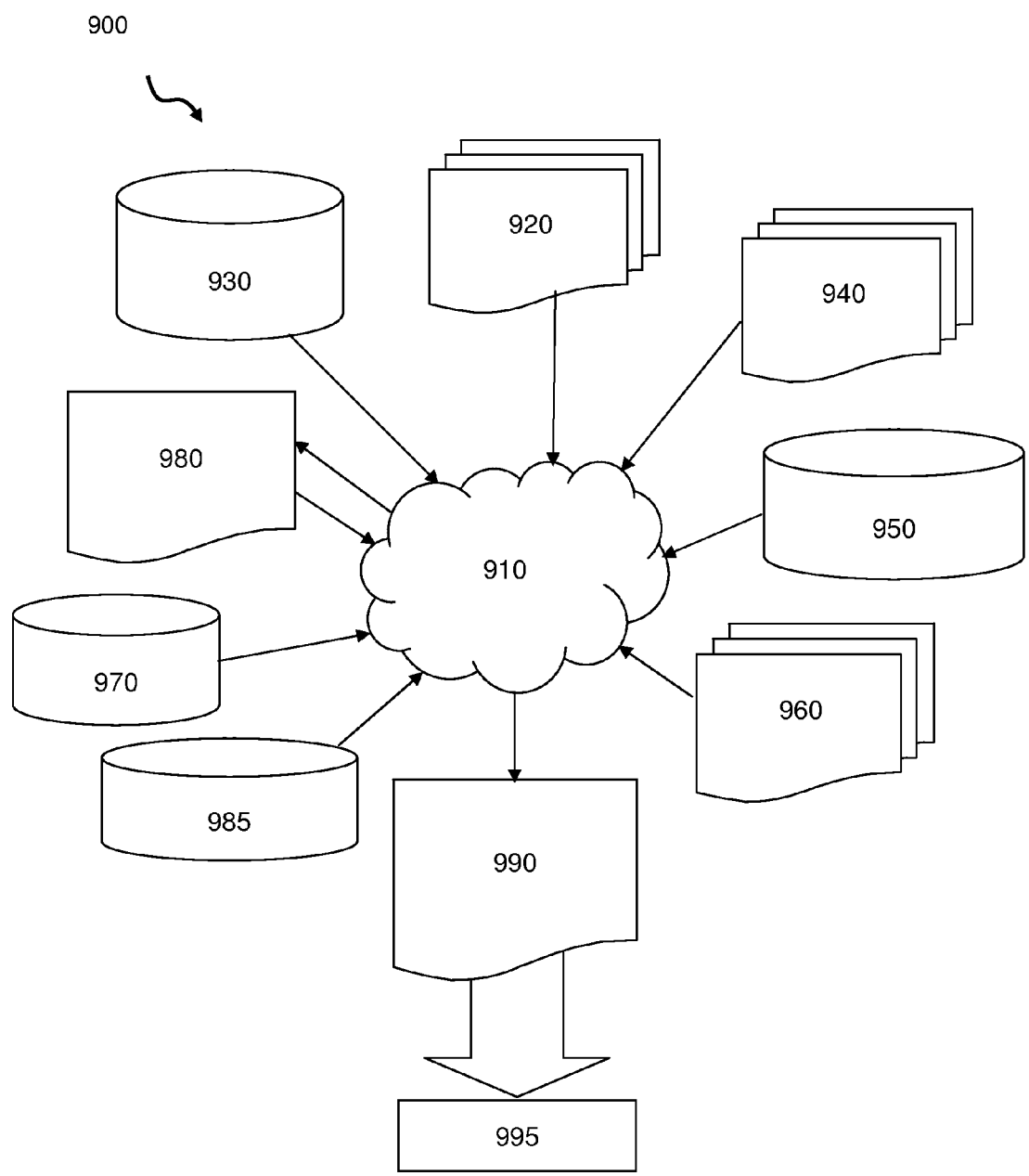
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method comprising:
   forming an opaque or semi-opaque layer on and directly contacting an entire a first side of a glass substrate; and
   forming one or more passive devices over the opaque or semi-opaque layer on a second side of the glass substrate; and
   entirely removing the opaque or semi-opaque layer from the first side of the glass substrate, prior to packaging,
   wherein the one or more passive devices are formed by etching and deposition of material processes through the first side of the glass substrate, and further comprising:
      forming a first crackstop in the second side of the glass substrate and on a first lateral side of the one or more passive devices; and
      forming a second crackstop in the second side of the glass substrate and on a second lateral side of the one or more passive devices, wherein
      the first crackstop is formed by:
         forming a trench in the second side of the glass substrate; and
         filling the trench with a polysilicon or metal;
      the second crackstop is formed by:
         forming a trench in the second side of the glass substrate; and
         filling the trench until it is pinched thereby forming a void within the glass substrate,
      the first crackstop and the second crackstop are different.

2. A method comprising:
   forming an opaque or semi-opaque layer on and directly contacting an entire a first side of a glass substrate;
   forming one or more passive devices over the opaque or semi-opaque layer on a second side of the glass substrate, wherein the one or more passive devices are formed by etching and deposition of material processes through the first side of the glass substrate;
   forming a first crackstop in the second side of the glass substrate and on a first lateral side of the one or more passive devices;
   forming a second crackstop in the second side of the glass substrate and on a second lateral side of the one or more passive devices, wherein the first crackstop and the second crackstop are different;
   entirely removing the opaque or semi-opaque layer from the first side of the glass substrate, prior to packaging; and
   roughening of the first side of the glass substrate and conformally filling the roughening with the opaque or semi-opaque layer.

3. The method of claim 2, wherein the opaque or semi-opaque layer is a doped polysilicon to provide a conductor for electrostatic chucking and a metal formed directly on the glass substrate.

4. A method comprising:
   forming an opaque layer on a backside of a glass substrate;
   forming one or more passive devices directly through the frontside of the glass substrate;
      entirely removing the opaque layer on the backside of the glass substrate prior to packaging,
      forming a first crackstop in the frontside of the glass substrate and on a first lateral side of the one or more passive devices;
      forming a second crackstop in the frontside of the glass substrate and on a second lateral side one or more passive devices;
      forming another passive device on the first side of the glass substrate, adjacent to the first crackstop;
      roughening of the backside of the glass substrate and conformally filling the roughening with the opaque layer wherein:
      the first crackstop is formed by:
         forming a trench in the frontside of the glass substrate; and
         filling the trench with a polysilicon or metal;
      the second crackstop is formed by:
         forming a trench in the frontside of the glass substrate; and
         filling the trench until it is pinched thereby forming a void within the glass substrate, and
      the opaque layer is formed directly on the glass substrate.

* * * * *